United States Patent [19]

Irving

[11] 4,283,758
[45] Aug. 11, 1981

[54] ENCAPSULATED NEON LAMPS

[76] Inventor: James H. Irving, 119 Ross Ave., Ottawa, Ontario, Canada

[21] Appl. No.: 60,032

[22] Filed: Jul. 23, 1979

[51] Int. Cl.³ ............................................. F21V 23/04
[52] U.S. Cl. .................................... 362/251; 362/249; 362/812
[58] Field of Search ......................... 362/251, 249, 812

[56] References Cited

U.S. PATENT DOCUMENTS

| 3,309,806 | 3/1967 | Gallagher | 362/812 X |
|---|---|---|---|
| 4,143,411 | 3/1979 | Roberts | 362/362 X |

Primary Examiner—Stephen J. Lechert, Jr.
Attorney, Agent, or Firm—Wenderoth, Lind & Ponack

[57] ABSTRACT

A light module comprises several neon lamps and resistors encapsulated in a translucent plastic material. Terminals accessible for impressing a voltage across the lamps are also provided. Preferably the lamps are provided on one side of a printed circuit board and the resistors on the other. Neon lamps do not generate as much heat as incandescent lamps and can thus be more closely confined without burning out than incandescent lamps. The use of several neon lamps introduces a redundancy feature which permits the device to operate satisfactorily even if one lamp burns out. The encapsulation protects the lamps, resistors and connections generally in handling. In a particular application, the encapsulated module operates as the light source in a push button elevator call switch, the module being movable and transmitting a manually applied force to the movable contacts.

10 Claims, 4 Drawing Figures

ENCAPSULATED NEON LAMPS

BACKGROUND OF THE INVENTION

This invention relates to light modules and, more particularly, to light modules which can be used effectively to illuminate confined areas such as are present in push button switches.

Historically, all illuminated push buttons and small illuminated signs and devices have used incandescent lamps. Because of the heat these lamps produce they often have to be spaced from the symbol, such as a floor number in the case of an elevator call switch, they have to illuminate thus increasing the size of the device. Particularly because of the confined spaces in which these lamps have to operate the lamps tend to burn out quickly necessitating frequent replacement at high labor cost and inconvenience to the user.

These problems could be reduced by reducing the lamp voltage but this, naturally, reduces the illumination which could be problematic when the device is intended to operate in a brightly lit environment such as an elevator lobby.

In known push button switches which provide illumination of the button the lamp is stationarily mounted at the bottom of the switch assembly with push button actuator and contact carrier being movable above it. Because of this arrangement holes must be provided in the bottom of the switch housing and the contact carrier to permit light to reach the push button. Furthermore, access of the lamp for replacement is difficult.

SUMMARY OF THE INVENTION

It is an object of the present invention to provide a compact light module which can be used with advantage for different applications such as in an illuminated sign or in a push button switch assembly.

It is also an object of the present invention to provide a compact light module capable of illuminating effectively small signs and alpha-numeric symbols such as elevator indicators and call switches.

It is further an object of the present invention to provide a rugged light module which has a long life and is not subject to easy breakage, either deliberate or accidental.

It is also an object of the present invention to provide a light module which can be used where space is at a premium.

These and other objects are achieved in accordance with a preferred embodiment of the invention by providing several parallel circuits, each containing a series connected miniature neon lamp and resistor. The lamps are mounted on one side of a small printed circuit board and, to reduce the outside dimensions of the P.C.B., the resistors are mounted on the underside of the P.C.B. The upper side of the board is preferably provided with a white highly reflective surface.

The P.C.B. and all the components are encapsulated in a rigid translucent plastics material along with two terminals for connection to the parallel circuits, the terminals projecting from the thus created plastics module for connection to a normal electrical utility supply voltage.

The resulting product is compact and robust, there is no danger of any of the neon lamps being broken either deliberately or accidentally. There is practically no heat generated and so the module may be positioned hard against the symbol to be illuminated, thus reducing the overall size of the device.

Furthermore, because the lamps are totally encapsulated, there is no danger of explosion even in potentially dangerous environments. Moreover, the illuminating ability of such a miniature module is highly effective and, even in situations where the ambient light level is high such as elevator lobbies, the light module of the present invention has been proved to provide a more than satisfactory level of illumination.

Finally, the incorporation of several neon lamps in the one module provides a redundancy feature which can be used to ensure that the module is still effective even if one lamp burns out.

The module of the present invention is, in a particular embodiment, incorporated in a push button switch and, in this embodiment, the module itself is sufficiently robust to act as the manually operable push button.

BRIEF DESCRIPTION OF THE DRAWINGS

The invention is pointed out with particularity in the appended claims. However, other features of the invention will be best understood by referring to the following detailed description in conjunction with the accompanying drawings, in which:

DESCRIPTION OF THE PREFERRED EMBODIMENT

Figure 3:
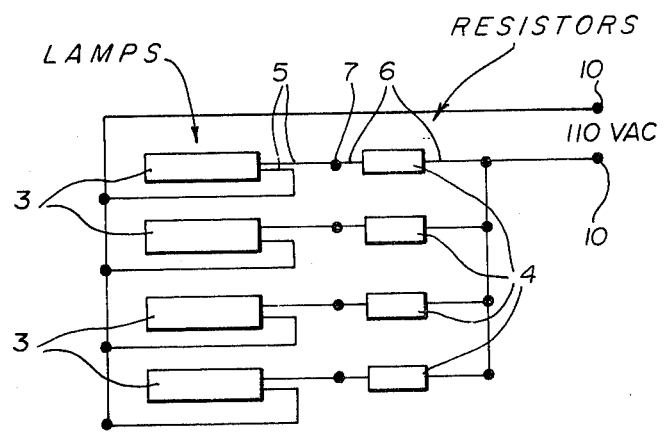
FIG. 3 is a circuit diagram showing the components and interconnections in the module.
Figure 4:
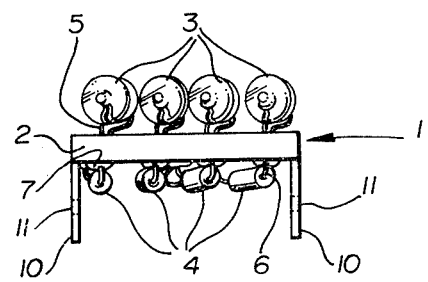
FIG. 4 is a side view of the module prior to encapsulation.

With reference firstly to FIGS. 3 and 4, a module 1 comprises a substrate 2 carrying on one side thereof four neon lamps 3 and on the other side four resistors. The substrate 2 is, in this embodiment, a printed circuit board (PCB) having conductors on the underside of the board. The upper side of the board, i.e. the side bearing the lamps should preferably be light in colour, e.g. white. The leads 5 of the neon lamps pass through the substrate and are soldered to conductors of the PCB as are leads 6 of the resistors. The reference numeral 7 indicates such soldered connections.

Two metal tabs 10 project perpendicularly from the underside of the PCB, the tabs being provided at opposite edges of the PCB. Each tab has a tapped through hole 11. Alternatively the tabs may simply be formed with flat contact portions.

The interconnections of the lamps, resistors and tabs can be seen in FIG. 3 from which it is clear that each lamp 3 is serially connected to a respective 70 K.ohm resistor, thus forming four parallel branches each connected across the tabs 10.

Figure 1:
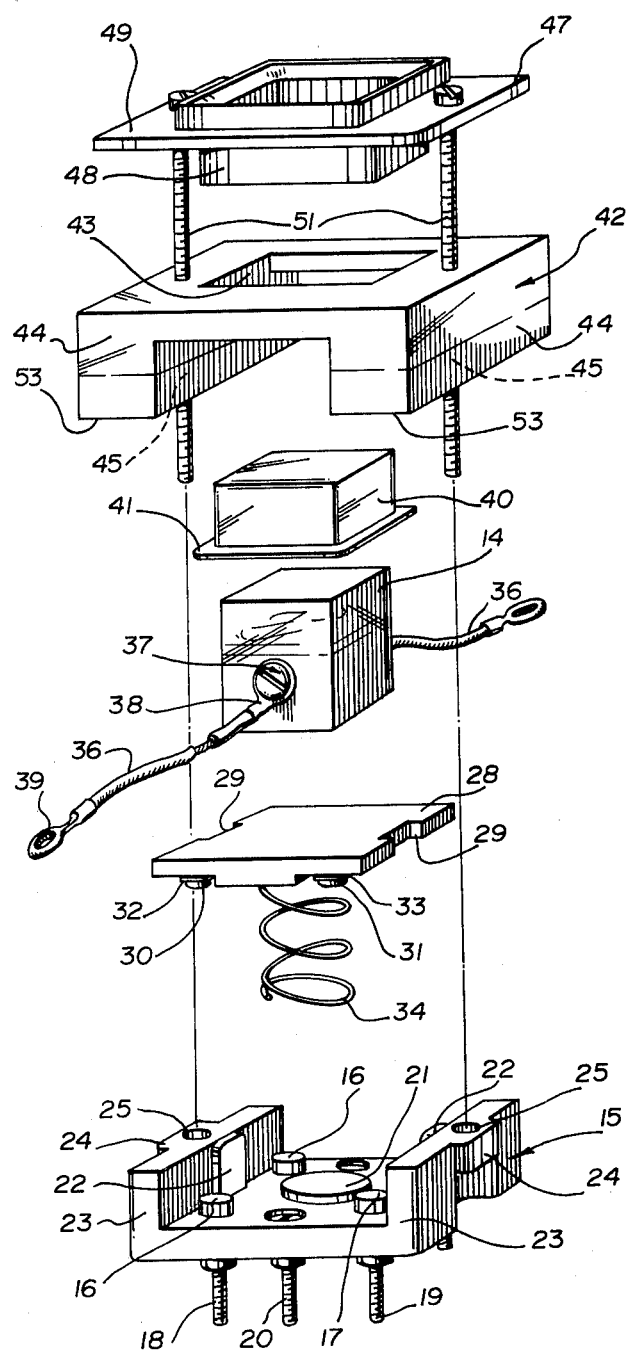
FIG. 1 is an exploded perspective view of a switch assembly incorporating a module embodying the invention.

The assembly of FIG. 4 is then encapsulated in a clear, water-white casting resin such as the resin sold under the trade mark CANVS C-32 to obtain the modular block 14 shown in FIG. 1. The encapsulation is carried out using a mould which ensures that there are two holes (not shown) provided in opposite surfaces of the module 14 and registering, respectively, with the tapped holes 11 in the tabs 10. In the alternative arrangement the holes are provided in the bottom of the module and register with the flat contact portions.

Figure 2:
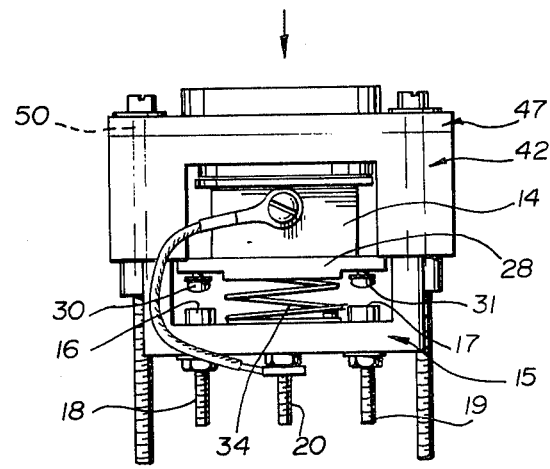
FIG. 2 is a side assembled view of the switch assembly of FIG. 1.

FIGS. 1 and 2, which illustrate a switch assembly, show a typical application of the module 14. The switch assembly is a modification of the type used in calling elevators, and includes a plastic base portion 15 upon which the other components are assembled. The base 15 is generally U-shaped and carries two pairs of stationary contacts 16 and 17 projecting upwardly from the bight. The contacts are formed on two pairs of terminal posts 18 and 19 which project through the material of the base downwardly from the bight. Another pair of terminal posts 20 project downwardly from the base 15.

A central boss 21 is formed centrally on the upper surface of the bight of the base 15 and two flat projections 22, are formed in opposed legs 23 of the base 15. Flange portions 24 projecting laterally from the top of the legs each have a through hole 25.

A contact carrier 28 is formed as a generally rectangular plastic plate having recesses 29 on two opposed edges. Two pairs of contacts 30 and 31 are carried on the underside of the carrier 28 for mating, respectively, with the contacts 16 and 17. The contacts 30 are formed at opposite ends of a slightly resilient conductive strip 32 mounted on the underside of the carrier, and the contacts 31 are similarly formed on a strip 33. One end of a helical compression spring 34 is mounted centrally to the underside of the carrier 28 and the other end of the spring is received round the boss 21 on the base 15.

The carrier 28 is arranged to move to and from the base, the projections 22 being received in the recesses 29 and acting as guides. The spring 34 normally urges the carrier away from the base but the carrier can be moved against the action of the spring 34 so that the contacts 30 and 31 engage, respectively, the contacts 16 and 17 to bridge each pair of contacts 16 and 17.

The light module 14 rests on the upper surface of the contact carrier 28. Two leads 36 are connected to the tabs 10 of the module by means of screws 37 received through ring terminals 38 and the tapped holes 11. The other ends of the leads 36 are connected by means of ring terminals 39 to the respective terminal posts 20. In the alternative configuration of the tabs, spring loaded contacts connected to the posts 20 replace the leads 36, the contacts engaging the flat tab portions of the module.

A transparent plastic cup 40 having a rim 41 around its open end is received over the top of the module 14. The cap 40 carries on its downward facing surface a number designating a floor.

An inverted generally U-shaped housing member 42 has a rectangular hole 43 extending through the bight of the U. The legs 44 of the member 42 each have a through hole 45, the holes 45 registering respectively with the holes 25 on the base 15.

A trim member 47 has a rectangular channel portion 48 and a peripheral flange 49, the flange having two through holes 50. The trim member is dimensioned to rest on the member 44 with the flange 49 abutting the bight of the member 44 and a portion of the rectangular channel 48 projecting through the hole 43. The holes 50 register with the holes 45 and 25.

The cap 40 is received in the lower end of the rectangular channel 48, the rim 41 abutting the lower edges of the channel 48 to limit upward sliding movement of the cap 41 relative to the channel 48. Two long screws 51 are received through holes 50, 45, and 25 and cooperate with nuts (not shown) to maintain the components in assembled condition.

As can be seen in FIG. 2, the coil spring 34 acts on the underside of the contact carrier 28 to urge the contact carrier 28, module 14 and cap 40 upwardly. The downwardly facing surfaces 53 of the legs 44 of housing member 42 overlap the legs 23 of base 15 to define stops limiting upward movement of the contact carrier 28. Upward movement of the module 14 and cup 40 is limited, as indicated above, by abutment of the rim 41 with the channel 48. In this position, the contacts 30 and 31 are remote from the contacts 16 and 17, respectively.

On depressing temporarily the top of the cap 40, the cap together with the module 14 and contact carrier 28 are depressed causing momentary bridging of the contacts 16 by contacts 30 and of the contacts 17 by contacts 31. The terminal posts 18, 19 and 20 would be connected in a conventional manner to the elevator control circuitry so that this momentary bridging of the contact pairs 16 and 17 would summon the elevator and cause 110 volts to be applied to terminals 20 to illuminate the module 14.

If one or two of the neon lamps were to burn out the module would still give sufficient light at least under some environmental conditions. If it is necessary to replace the module this can easily be done simply by removing the screws 51 and 37.

It is to be noted that a standard size module can be used effectively with various conventional trims 47 having different sized channel portions 48 and caps 40 providing the cap is big enough to fit over the end of the module.

Instead of using the modules as push-button actuators as described above, they may conveniently be used to illuminate numbers or other indicia on an indicator board, such as an elevator indicator board.

Although, the module 14 has been described, in the above embodiment, as being encapsulated, it is envisaged that the module would operate effectively without encapsulation in the simple role as a stationary light source. Moreover, the module could be used as a push-button without encapsulating it; it could for example be contained in a stainless steel container having perforations to allow illumination.

It should be noted that the grouping of the neon lamps provides a high level of illumination with practically no generation of heat. This permits close tolerances and permits the light source to be located very close or in contact with the symbol to be illuminated, thus reducing the overall size of the device.

The encapsulated module, whether or not in a push button switch, can be used in particular environments where open bulbs and contacts may be hazardous.

Changes may be made in the construction and arrangement of the parts or elements of the embodiment as disclosed herein without departing from the spirit or scope of the invention as defined in the following claims.

What I claim:

1. A compact light module for use with normal electrical utility supply voltage, the module comprising an assembly of a plurality of miniature neon lamps and resistors and two terminals, the lamps and resistors being connected to the terminals to provide a plurality of circuits connected permanently across the terminals, each circuit comprising a neon lamp and a resistor, the assembly being encapsulated in a rigid translucent plastics material through which the terminals project for connection to the supply voltage.

2. A light source as claimed in claim 1, in which the lamps, resistors and terminals are mounted on a printed circuit board.

3. A light source as claimed in claim 2, in which the lamps are mounted on one side of the printed circuit board and the resistors on the other.

4. A light source as claimed in claim 3, in which the one side of the printed circuit board is highly reflective.

5. An illuminated push button switch assembly comprising the module as claimed in claim 1, 2 or 3, at least one movable contact mounted for movement with the module, at least one stationary contact aligned for engagement with the movable contact, the module being movable by manual engagement between a first position in which the stationary and movable contacts are open and a second position in which the stationary and movable contacts are closed, and resilient means urging the module and movable contact to one of the two positions.

6. An illuminated push button switch assembly comprising the module as claimed in claim 4, at least one movable contact mounted for movement with the module, at least one stationary contact aligned for engagement with the movable contact, the module being movable by manual engagement between a first position in which the stationary and movable contacts are open and a second position in which the stationary and movable contacts are closed, and resilient means urging the module and movable contact to one of the two positions.

7. An illuminated push button switch assembly comprising the module as claimed in claim 1, 2 or 3, a movable contact carrier carrying at least one pair of electrically interconnected movable contacts, at least one pair of stationary contacts mounted on a housing portion, the module engaging the contact carrier, a translucent cap bearing an alpha-numeric notation mounted on the module, the cap being movable by manual engagement between a first position in which the stationary contacts are not bridged by the movable contacts and a second position in which the stationary contacts are bridged by the movable contacts, resilient means urging the contact carrier, module and cap to one of the two positions, the light module having flexible leads interconnecting the terminals of the module with terminals on the housing portion.

8. An illuminated push button switch assembly comprising the module as claimed in claim 4, a movable contact carrier carrying at least one pair of electrically interconnected movable contacts, at least one pair of stationary contacts mounted on a housing portion, the module engaging the contact carrier, a translucent cap being an alpha-numeric notation mounted on the module, the cap being movable by manual engagement between a first position in which the stationary contacts are not bridged by the movable contacts and a second position in which the stationary contacts are bridged by the movable contacts, resilient means urging the contact carrier, module and cap to one of the two positions, the light module having flexible leads interconnecting the terminals of the module with terminals on the housing portion.

9. An illuminated push button switch assembly comprising the module as claimed in claim 1, 2 or 3, a movable contact carrier carrying at least one pair of electrically interconnected movable contacts, at least one pair of stationary contacts mounted on a housing portion, the module engaging the contact carrier, a translucent cap bearing an alpha-numeric notation mounted on the module, the cap being movable by manual engagement between a first position in which the stationary contacts are not bridged by the movable contacts and a second position in which the stationary contacts are bridged by the movable contacts, resilient means urging the contact carrier, module and cap to one of the two positions, the terminals of the module having flat contacts engaging spring loaded contacts connected with terminals on the housing portion.

10. An illuminated push button switch assembly comprising the module as claimed in claim 4, a movable contact carrier carrying at least one pair of electrically interconnected movable contacts, at least one pair of stationary contacts mounted on a housing portion, the module engaging the contact carrier, a translucent cap bearing an alpha-numeric notation mounted on the module, the cap being movable by manual engagement between a first position in which the stationary contacts are not bridged by the movable contacts and a second position in which the stationary contacts are bridged by the movable contacts, resilient means urging the contact carrier, module and cap to one of the two positions, the terminals of the module having flat contacts engaging spring loaded contacts connected with terminals on the housing portion.

* * * * *